(12) United States Patent
Takeuchi et al.

(10) Patent No.: US 6,545,421 B1
(45) Date of Patent: Apr. 8, 2003

(54) CURRENT CONTROLLING ELEMENT

(75) Inventors: Yukihisa Takeuchi, Nishikamo-Gun; Tsutomu Nanataki, Toyoake; Iwao Ohwada, Nagoya, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/688,480

(22) Filed: Oct. 16, 2000

Related U.S. Application Data

(63) Continuation-in-part of application No. 09/649,538, filed on Aug. 28, 2000.

(51) Int. Cl.$^7$ ................................................ G09G 3/10
(52) U.S. Cl. ............................ 315/169.1; 315/169.3; 385/129; 385/19; 345/90; 345/84; 310/328
(58) Field of Search .................... 315/169.1, 169.3, 315/169.4; 385/129, 19, 901; 345/90, 84; 310/328

(56) References Cited

U.S. PATENT DOCUMENTS

| | | | | |
|---|---|---|---|---|
| 5,862,275 A | * | 1/1999 | Takeuchi et al. | ............... 385/19 |
| 6,028,978 A | * | 2/2000 | Takeuchi et al. | ............. 385/147 |
| 6,265,811 B1 | * | 7/2001 | Takeuchi et al. | ............. 310/330 |
| 6,281,868 B1 | * | 8/2001 | Takeuchi et al. | ............... 345/90 |

OTHER PUBLICATIONS

U.S. patent application Ser. No. 09/688,622, Takeuchi et al., filed Oct. 16, 2000.

* cited by examiner

Primary Examiner—Don Wong
Assistant Examiner—Tuyet T. Vo
(74) Attorney, Agent, or Firm—Burr & Brown

(57) ABSTRACT

An actuator having a fixed portion, a vibrating portion supported on the fixed portion so as to undergo vibrations, and an actuating portion including a first and a second electrodes formed on both sides or one side of a deformable layer is provided. The actuator generates a displacement motion by holding the offset electric potential of the first electrode at a desired valve and variable-controlling an electric potential of the second electrode. A cathode for emitting electrons is formed on the actuator. The current controlling element changes the position of the cathode with respect to the plate by the displacement motion of the actuator obtained by changing an electric potential difference of the second electrode to the offset electric potential, and adjusts the offset position of the cathode according to the offset electric potential, to adjust a control range of a current value taken out of the plate.

22 Claims, 13 Drawing Sheets

CURRENT CONTROLLING ELEMENT

This is a continuation-in-part of application Ser. No. 09/649,538 filed Aug. 28, 2000.

TECHNICAL FIELD

The present invention relates to current controlling elements which are designed to function as multielectrode tubes such as tetrodes or pentodes used for radios, television sets, or the like.

BACKGROUND ART

Such a current controlling element or, a multielectrode tube has not only a plate and a cathode, but also a plurality of grids. For example, in the case of a tetrode, arranging a screen grid between a control grid and a plate reduces the electrostatic capacity therebetween to eliminate instability at high frequency occurring in the case of a triode, which prevents output characteristics from lowering due to a plate voltage drop occurring at the time of a high plate current.

Also, in the case of a pentode, arranging a suppressor grid between a screen grid and a plate further increases the screening effect to realize a stable operation, which provides a low distortion and large output.

Such a current controlling element controls a plate voltage to take out a current from the plate.

However, a conventional current controlling element requires an element like a power amplifier in order to control the plate voltage, which causes an increase of the cost. Also, using such an element provides a disadvantage of increasing the power consumption.

Besides, such an conventional current controlling element is difficult in integration. Therefore, it is not suitable for the current controlling element with a comparatively small size and a comparatively high current value.

It is therefore an object of the present invention to provide a current controlling element which is capable of reducing the cost and the power consumption.

It is another object of the present invention to provide a current controlling element which has a comparatively small size and a comparatively high power.

SUMMARY OF THE INVENTION

The present invention provides a current controlling element comprising an actuator having a fixed portion, a vibrating portion supported on the fixed portion so as to undergo vibrations, and an actuating portion including a first and a second electrode formed on both side surfaces or one side surface of a deformable layer, the actuator generating a displacement motion by holding an offset electric potential of the first electrode at a desired value and controlling variably an electric potential of the second electrode, a and a cathode formed on the actuator and emitting electrons. A plate for receiving the electrons emitted from the cathode and a grid arranged between the cathode and the plate are also proveded. The current controlling element changes the position of the cathode with respect to the plate by the displacement motion of the actuator obtained by changing an electric potential difference of the second electrode to the offset electric potential, and adjusting the offset position of the cathode according to the offset electric potential, to adjust a control range of a current value taken out of the plate.

According to the present invention, the current value taken out of the plate is controlled by changing the position of the cathode with respect to the plate by a displacement motion of the actuator, thereby enabling the electric potential of the plate with respect to the cathode to be held at a constant value, which eliminates the need of disposing an element, like a power amplifier, for controlling a plate voltage. This makes a current controlling element with a relatively low cost possible.

A control range of a current value taken out of the plate is adjusted by the offset electric potential, thereby providing the same function as a screen grid of a conventional multielectrode tube, which enables a screen grid to be omitted without impairing a function of the conventional multielectrode tube. This further lowers the cost.

Also, the voltage applied to the first and the second electrodes is less than the plate voltage. Therefore, changing only the voltage less than the plate voltage enables the plate current to be controlled, which results in a decrease of the electric power consumption.

According to an offset position of the cathode obtained by adjusting an offset electric potential of the first electrode, the control range of a current value taken out of the plate can be easily adjusted. For example, the insulating layer is formed on the first and/or the second electrode, and the cathode is formed on the insulating layer.

Preferably, the current controlling element comprises a plurality of cathodes corresponding to one plate, and a plurality of actuators corresponding to a plurality of cathodes, respectively. Thus integrating the actuators at a high density makes the current controlling element with a comparatively small size and a comparatively high current output possible.

Preferably, when constituting the actuator, the vibrating portion is formed of ceramics, the vibrating portion and the fixed portion are integrally formed, or the vibrating portion and the fixed portion are integrally formed of ceramics, or the actuating portion, the vibrating portion and the fixed portion are integrally formed. Further, the deformable layer is formed of at least one kind of a piezoelectric material, an electrostrictive material, and an antiferroelectric material.

Further, the current controlling device can be comprised of a plurality of the current controlling elements, and a substrate on which a plurality of the actuators of the current controlling elements are integrally formed. On this occasion, constituting a plurality of the current controlling elements as one element provides an electric control device which is capable of generating a comparatively high current, or a current controlling device having a plurality of current controlling elements separated by a cell construction and integrated together.

The present invention provides a current controlling element comprising an actuator having a fixed portion, a vibrating portion supported on the fixed portion so as to undergo vibrations, and an actuating portion including a first and a second electrodes formed on both sides or one side of a deformable layer, the actuator generating a displacement motion by holding an electric potential of the first electrode at a constant value and variable-controlling an electric potential of the second electrode, a cathode being formed on the actuator and emitting electrons and a plate receiving the electrons emitted from the cathode. The current controlling element changes the position of the cathode with respect to the plate by the displacement motion of the actuator to control a current value taken out of the plate, and the actuator maintains the displacement state by setting the electric potential of the first electrode at a certain value while holding the electric potential of the second electrode at the neighborhood of zero.

According to the present invention, as the actuator maintains the displacement state by setting the electric potential of the first electrode at a certain value while holding the electric potential of the second electrode at the neighborhood of zero, it is not necessary to apply the voltage continuously to the second electrode in order to maintain the displacement of the actuator. As a result, there is little power consumption resulting from the resistance of the current controlling element or a circuit including the current controlling element, and thus it is possible to reduce the power consumption of the current controlling element or the circuit including the current controlling circuit, because an actuator driving circuit is provided on the side of the second electrode and the power consumption resulting from the resistance of the actuator driving circuit can be omitted.

Preferably, the current controlling element further comprises a switching element which switches between the displacement motion and the maintenance of the displacement state of the actuator. Thereby, the switching between the displacement motion and the maintenance of displacement state of the actuator is well performed so that it is not necessary to apply the voltage to the second electrode in order to maintain the displacement of the actuator, and thus it is possible to reduce the power consumption of the current controlling element or the circuit including the current controlling circuit further more. Also, as there is no limitation of the choice of the actuator material to be subjected to the displacement motion and the maintenance of displacement state of the actuator, and thus the limitation of the choice of the actuator material is relaxed.

For example, the switching element has any one of transistor, a varistor and a piezoelectric relay. Especially, if the varistor is selected as the switching element, the limitation of choice of the actuator material is more relaxed because the good switching property can be obtained.

A current controlling element according to an embodiment of the present invention will be described with reference to the drawings.

DETAILED DESCRIPTION OF THE INVENTION

Figure 1:
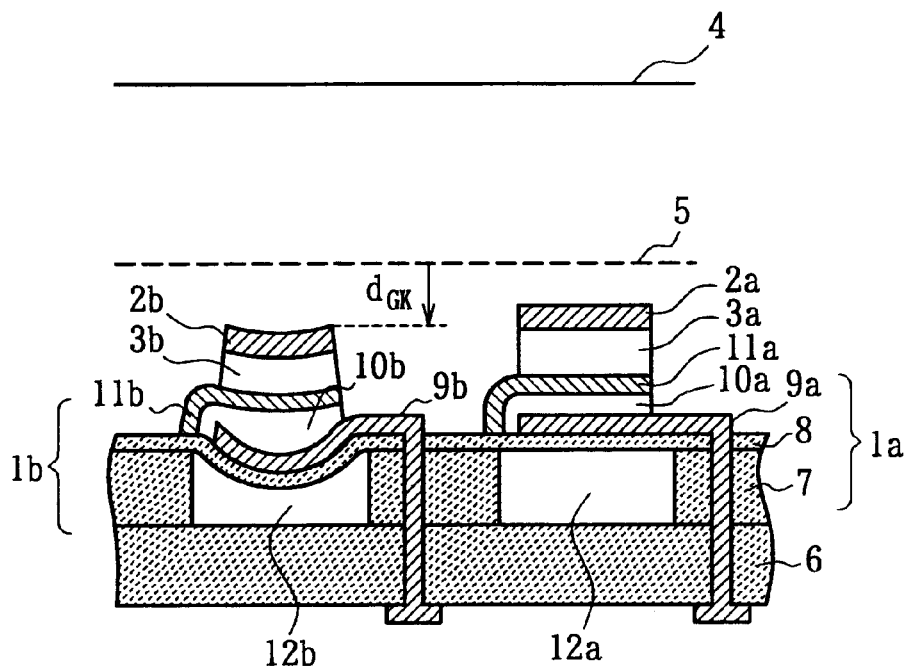
FIG. 1 is a sectional view of a current controlling element according to a first embodiment of the present invention.

FIG. 1 is a sectional view of a current controlling element according to a first embodiment of the present invention. The current controlling element comprises actuators 1a, 1b, cathodes 2a, 2b formed on the actuators 1a, 1b and emitting electrons, respectively, insulating layers 3a, 3b interposed between the actuators 1a, 1b and the cathodes 2a, 2b, respectively, a common plate 4 receiving the electrons emitted from the cathodes 2a, 2b, and a common control grid 5 arranged between cathodes 2a, 2b and a plate.

The illustrated current controlling element is integrated on a substrate 6, which provides a current controlling element. On this occasion, it is preferable to form a plurality of current controlling elements as one element to generate a high current, and to integrate a plurality of current controlling elements as an integrated circuit while separating them by a cell construction.

The actuator 1a, 1b comprise a common spacer layer 7, as a fixed portion, formed on the substrate 6, a common sheet layer 8 as a vibrating portion, actuator driving electrodes 9a, 9b, as second electrodes, formed on the sheet layer 8, deformable layers 10a, 10b formed on the actuator driving electrodes 9a, 9b, respectively, and actuator common electrodes 11a, 11b, as first electrodes, interposed between the insulating layers 3a, 3b and the deformable layers 10a, 10b, respectively.

A way of forming the actuators 1a, 1b and the substrate 5 is described in U.S. Pat. No. 5,210,455, one example of which is given as follows.

The sheet layer 8 is made to have relatively small thickness, thereby causing the sheet layer 8 itself to be easily subjected to vibrations from the external stress. The sheet layer 8 is preferably formed of a high heat resistant material. This is because the sheet layer 8 is prevented from deteriorating when forming at least the deformable layers 10a, 10b in a case where the sheet layer 8 directly supports the actuator driving electrodes 8a, 8b without using a material of a relatively low heat resistance in joining the actuator driving electrodes 9a, 9b to the sheet layer 8.

Further, it is preferred that the sheet layer 8 is formed of an insulating material in order to electrically separate wires formed on the substrate 6 and electrically connected to the actuator driving electrodes 9a, 9b, and wires similarly formed on the substrate 6 and electrically connected to the actuator common electrodes 11a, 11b.

Accordingly, it is the best that the sheet layer 8 is made of ceramics, although the sheet layer 8 can be formed of a high heat resistant metal or a material, like porcelain enameled finished material, of a high heat resistant metal coated with a ceramics material such as glass.

A ceramic composition forming the sheet layer 8 includes, for example, stabilized zirconium oxide, aluminum oxide, magnesium oxide, titanium oxide, spinel, mullite, aluminum nitride, silicon nitride, glass, mixtures thereof, and the like. Among them, the stabilized zirconium oxide and the aluminum oxide are preferable from the viewpoint of strength and rigidity. The stabilized zirconium oxide is especially preferable because it causes the sheet layer 8 to have a relatively high mechanical strength and a relatively high toughness even if the sheet layer 8 has a small thickness, it undergoes relatively less chemical reaction with the actuator driving electrodes 9a, 9b, the deformable layers 10a, 10b, and the actuator common electrodes 11a, 11b, and the like. Moreover, the stabilized zirconium oxide includes not only usual stabilized zirconium oxide but also partially stabilized zirconium oxide. The stabilized zirconium has a crystal structure such as cubic crystal, thereby providing no phase transition.

On the other hand, the zirconium oxide may undergo phase transition between monoclinic crystal and tetragonal crystal at about 1000° C.. Therefore, such phase transition may provide cracking. The stabilized zirconium contains 1–30 mole % of a stabilizing material such as calcium oxide, magnesium oxide, yttrium oxide, scandium oxide, ytterbium oxide, cerium oxide, rare earth metal oxide, and the like. Preferably, the stabilizing material contains yttrium oxide in order to improve the mechanical strength of the sheet layer 8. On this occasion, it contains preferably 1.5–6 mole %, more preferably 2–4 mole % of yttrium oxide, and further preferably contains 0.1–5 mole % of aluminum oxide.

Besides, the crystal phase can be of a mixture phase of cubic crystal+monoclinic crystal, a mixture phase of tetragonal crystal+monoclinic crystal, a mixture phase of cubic crystal+tetragonal crystal+monoclinic crystal, and the like. It is the most preferable to contain mainly the tetragonal crystal, or the mixture phase of tetragonal crystal+cubic crystal among the above phases from the viewpoint of strength, toughness and durability.

When the sheet layer 8 is formed of ceramics, the sheet layer 8 contains relatively many crystal particles. For improving the mechanical strength of the sheet layer 8, the average crystal particle size is preferably held within a range of 0.05–2 $\mu$m, more preferably within a range of 0.1–1 $\mu$m.

The spacer layer 7 has cavities 12a, 12b at locations corresponding to the actuators 1a, 1b, respectively. Such cavities 12a, 12b are formed by the use of, e.g. a screen printing method.

The spacer layer 7 is preferably formed of a ceramics material, more specifically the material may be the same as the ceramic of the sheet layer 8 or different from the ceramic of the sheet layer 8. Such ceramic materials includes, for example, stabilized zirconium oxide, aluminum oxide, magnesium oxide, titanium oxide, spinel, mullite, aluminum nitride, silicon nitride, glass, mixtures thereof, and the like, as is the case with the ceramics material of the sheet layer 8.

The ceramic materials, except those of the substrate 6, the spacer layer 7, and the sheet layer 8, preferably include as a material of zirconium oxide as a major component, a material of aluminum oxide as a major component, a material comprising mixtures thereof as a major component, and the like. Among them, the material of zirconium oxide as a major component is especially preferable. Moreover, clay, or the like may be added thereto as a sintering assistant. On this occasion, the assistant composition is required to be adjusted so as not to excessively contain vitrescent materials such as silicone oxide and boron oxide. This is because, although these vitrescent materials are advantageous from the viewpoint of joining with the deformable layers 10a, 10b, the vitrescent materials accelerate reaction with the deformable layers 10a, 10b, thereby making it difficult for the deformable layers 10a, 10b to maintain a predetermined composition, which results in deterioration of the properties of the element.

In other words, preferably, silicone oxide, or the like contained in the substrate 6, the spacer layer 7 and the sheet layer 8 is limited so as to be not more than 3 wt %, preferably not more than 1 wt %. In this specification, the word "main component" means a component, the contents of which are not less than 50 wt %.

Preferably, the substrate 6, the spacer layer 7, and the sheet layer 8 are laminated into a three-layered product. These three layers are integrally joined to one another by simultaneous firing, or by afterward bonding by using glass or resin. Moreover, a four or more-layered product can be produced.

The actuator driving electrodes 9a, 9b are applied with a variable voltage from a power supply (not shown). These actuator driving electrodes 9a, 9b are formed of any electrically conductive material which can withstand oxidizing high temperature atmospheres, for example, a single metal, an alloy, a mixture of a metal or alloy, a mixture of an electrically insulating ceramic and alloy, preferably, high melting point noble metal such as platinum, palladium, or rhodium, or a material containing silver-palladium alloy, silver-platinum alloy or platinum-palladium alloy, and the like as a major component or components, or a cement material of platinum and ceramic material. More preferably, it is formed of only platinum, or a material containing platinum-based alloy as a major component or components. Moreover, the percentage of ceramic material contents in the electrode material is preferably 5–30 vol %. Further, the percentage is preferably 5–20 vol % when using the piezoelectric material/electrostrictive material as the ceramic material.

The actuator driving electrodes 9a, 9b can be formed by a usual film forming method, including various kinds of thick-film forming methods such as screen printing, spray, coating, dipping, application, electrophoresis, and various kinds of thin-film forming methods such as sputtering, ion-beam, vacuum vapor deposition, ion plating, CVD, and plating. Preferably, a thick-film forming method is employed.

When the actuator driving electrodes 9a, 9b are formed by the use of the thick-film forming method, their thickness is generally not more than 20 $\mu$m, preferably not more than 5 $\mu$m.

The deformable layers 10a, 10b are displaced by application of an electric field, and formed of at least one kind of a piezoelectric material, an electrostrictive material, and an antiferroelectric material. The piezoelectric material and/or the electrostrictive material can include a material containing lead zirconate (PMN-based) as a major component, a material containing lead nickel niobate (PNN-based) as a major component, a material containing lead zinc niobate as a major component, a material containing lead manganese niobate as a major component, a material containing lead magnesium tantalate as a major component, a material containing lead nickel tantalate as a major component, a material containing lead antimony stannate as a major component, a material containing lead titanate as a major component, a material containing lead magnesium tungstate as a major component, a material containing lead cobalt niobate as a major component, or composite materials containing any combination thereof as a major component. Among them, ceramics containing lead magnesium tungstate is the most frequently used as the piezoelectric material and/or the electrostrictive material.

When the piezoelectric material and/or electrostrictive material are made of ceramics, the material can include oxides of lanthanum, barium, niobium, zinc, cerium, cadmium, chromium, cobalt, antimony, iron, yttrium, tantalum, tungsten, nickel, manganese, lithium, strontium, bithmus, and the like, or any combination thereof, or materials suitably added with other compounds. Their materials are preferably added with a predetermined additive into, for example, a PLZT-based material.

Among these piezoelectric material and/or electrostrictive material, there are preferably employed a material containing lead magnesium niobate, lead zirconate, and lead titanate as major components, a material containing lead nickel niobate, lead magnesium niobate, lead zirconate, and lead titanate as major components, a material containing lead magnesium niobate, lead nickel tantalate, lead zirconate, and lead titanate as major components, a material containing lead magnesium tantalate, lead magnesium niobate, lead ziroconate, and lead titanate as major composition, their materials with strontium and/or lanthanum substituted for a part of lead, and the like. These materials are preferable as the deformable layers 10a, 10b which are formed by the thick-film forming method such as the screen printing.

When multicomponent piezoelectric material and/or electrostrictive materials are employed, the piezoelectric and/or electrostrictive properties are varied according to the composition of the component. Especially, not only for a three components-based material of lead magnesium niobate-lead zirconate-lead titanate employed in this embodiment, but also for a four components-based materials of lead magnesium niobate-lead nickel tantalate-lead titanate, and lead magnesium tantalate-lead magnesium niobate-lead nickel tantalate-lead titanate, the composition in the vicinity of the boarder of pseudo-cubic crystal-tetragonal crystal-rhombohedral crystal is preferable. Especially, a composition of lead magnesium niobate: 15–50 mole %, lead zirconate: 10–45 mole %, and lead titanate: 30–45 mole %, a composition of lead magnesium niobate: 15–50 mole %, lead nickel tantalate: 10–40 mole %, lead zirconate: 10–45 mole %, and lead titanate: 30–45 mole %, and a composition of lead magnesium niobnate: 15–50 mole %, lead nickel tantalate: 10–40 mole %, lead zirconate: 10–45 mole %, and lead titanate: 30–45 mole % are preferably employed because they have a high piezoelectric constant and a high electromechanical coupling factor.

Further, when an antiferroelectric material is employed, the material preferably includes a material containing lead zirconate as a major component, a material containing lead zirconate and lead stannate as major components, a material containing lead zirconate added with lanthanum oxide, and a material containing lead zirconate and lead stannate as major components added with lead zirconate and lead niobate. Particularly, when the driving voltage is low, the antiferroelectric material including lead zirconate and lead stannate is preferably employed. The composition is given as:

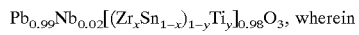

$Pb_{0.99}Nb_{0.02}[(Zr_xSn_{1-x})_{1-y}Ti_y]_{0.98}O_3$, wherein $(0.5 < x < 0.6, 0.05 < y < 0.063)$.

Besides, the antiferroelectric material may be porous. On this occasion, the porosity is preferably not more than 30%.

The deformable layers 10a, 10b are preferably formed by the use of the above-mentioned thick-film forming method. Particularly, the screen printing method is preferably used because it performs the printing precisely at a low cost. Moreover, the thickness of the deformable layers 10a, 10b is preferably not more than 50 µm, more preferably not more than 3–40 µm, e.g. in order to provide a large displacement at a low operating voltage.

Such a thick-film forming method is capable of forming a film on a surface of the sheet layer 7, using a paste or slurry containing, e.g. piezoelectric and/or electrostrictive ceramic particles of 0.01–7 µm, preferably, 0.05–5 µm in average particle diameter as major components, which provides excellent element properties.

The electrophoresis method is capable of forming a film at high density and at highly accurate dimensions, and has characteristics described in the technical document "DENKI KAGAKU 53, No. 1(1985), p63–68, authored by Kazuo ANZAI)" and "The Fist Study Symposium of Ceramics Higher-Order Forming Method by Electrophoretic, preliminary report (1998), p5–6, p23–23". Accordingly, it is preferred that various kinds of methods are suitably selectively employed, considering required accuracy and reliability.

In case where the deformable layers 10a, 10b are formed of piezoelectric materials, when applied with no electric field, the deformable layer is flat as shown by reference number 10a, whereas when applied with an electric field, an electric field induced strain occurs to provide its lateral effect, thereby causing the deformable layer to be curvedly displaced in a concave manner as shown reference number 10b.

On the other hand, in a case where the deformable layers 9a, 9b are formed of an antiferroelectric material, when applied with no electric field, the deformable layer is flat, whereas when applied with an electric field, the deformable layer is curvedly displaced in a convex manner.

The actuator common electrodes 11a, 11b, while being held at a desired offset electric potential, are commonly connected to the actuators 1a, 1b, respectively, and then wired out of a back side of the substrate 6 through holes.

The actuator common electrodes 11a, 11b are preferably formed by the above-mentioned thick-film forming-method, although they can be formed by the same material and the same method as the actuator driving electrodes 9a, 9b. The actuator common electrodes 11a, 11b are generally not more than 20 µm, preferably not more than 5 µm.

These actuator common electrode 11a, 11b serves as a screen grid by controlling the amount of electrons of the cathode 2a, 2b due to an adjustment of the offset electric potential to a desired value, thereby bringing about a function of a tetrode without using a screen grid. As a result, it is possible to form a current controlling element having a function of a tetrode at a low cost.

Moreover, the total thickness of the actuator driving electrode 9a, 9b, the deformable layer 10a, 10b, and the actuator common electrode 11a, 11b is generally not more than 100 μm, preferably 50 μm.

As described above, whenever they are formed, respectively, the actuator driving electrodes 9a, 9b, the deformable layers 10a, 10b, and the actuator common electrodes 11a, 11b are heat-treated, that is, fired to be integrally formed with the sheet layer 8 into an integral construction. Otherwise, after they are all formed, the actuator driving electrodes 9a, 9b, the deformable layers 10a, 10b, and the actuator common electrodes 11a, 11b can simultaneously heat-treated, that is, fired to be simultaneously integrally joined with the sheet layer 8.

Moreover, according to a method of forming the actuator driving electrodes 9a, 9b, and the actuator common electrodes 11a, 11b, there may be no need for heat-treatment, that is, firing for integration.

The heat-treatment, that is, firing for integrating the sheet layer 8, the actuator driving electrodes 9a, 9b, the deformable layers 10a, 10b, and the actuator common electrodes 11a, 11b is generally effected at a temperatures within 500–1400° C., preferably a temperature within 1000–1400° C. Further, when heat-treating the film-like deformable layers 10a, 10b, the heat-treatment, that is, firing is preferably employed while controlling not only the evaporation sources of the deformable layers 10a, 10b but also their atmosphere such that the deformable layers 10a, 10b become unstable in composition at a high temperature, and further the firing is preferably employed while covering the deformable layers 10a, 10b with a suitable covering member such that the deformable layers 10a, 10b are not directly exposed to the firing atmosphere. On this occasion, the covering member is made of a material similar to those of the substrate 6 and the spacer layer 7.

The insulating layers 3a, 3b are also made of a material similar to those of the substrate 6 and the spacer layer 7. The cathodes 2a, 2b are formed by the same material and the same method as the actuator driving electrodes 9a, 9b and the actuator common electrodes 11a, 11b, and then wired out of a back side of the substrate 6 through holes.

An operation of this embodiment will be described hereinbelow. When applying a variable voltage $V_D$ to the actuator driving electrodes 9a, 9b, and applying an offset voltage $V_C$ to the actuator common electrodes 11a, 11b, the cathodes 2a, 2b get away from the plate 4, that is, the grid 5 by a distance $d_{GK}$.

Figure 2:
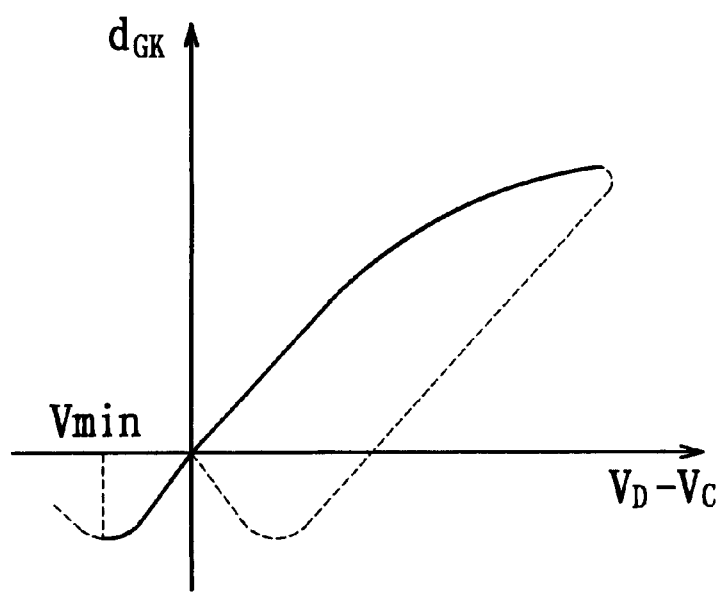
FIG. 2 is a view showing the relationship between a voltage difference of electrodes and a cathode-to-grid distance.

In the case where the actuators 1a, 1b are formed of piezoelectric materials, when $V_D$-$V_C$ is positive in voltage as shown by the actual line in FIG. 2, the larger a difference between the variable voltage $V_D$ and the offset voltage $V_C$ is, the longer the distance $d_{GK}$ is, whereas when $V_D$-$V_C$ is negative in voltage and larger than a voltage Vmin exhibits a coercive field, the distance $d_{GK}$ smaller than when applying no voltage. That is, the cathodes 2a, 2b get near the grid 5. Therefore, the distance $d_{GK}$ can be changed by controlling the difference between the variable voltage $V_D$ and the offset voltage $V_C$. The above variable voltage $V_D$ has a control range of not less than Vmin+$V_C$. Moreover, in FIG. 2, positive values for the ordinate are measured in such a direction as that the cathodes 2a, 2b get away from the grid 5, while positive values for the abscissa are measured in the polarization direction of the deformable layers 10a, 10b.

Figure 3:
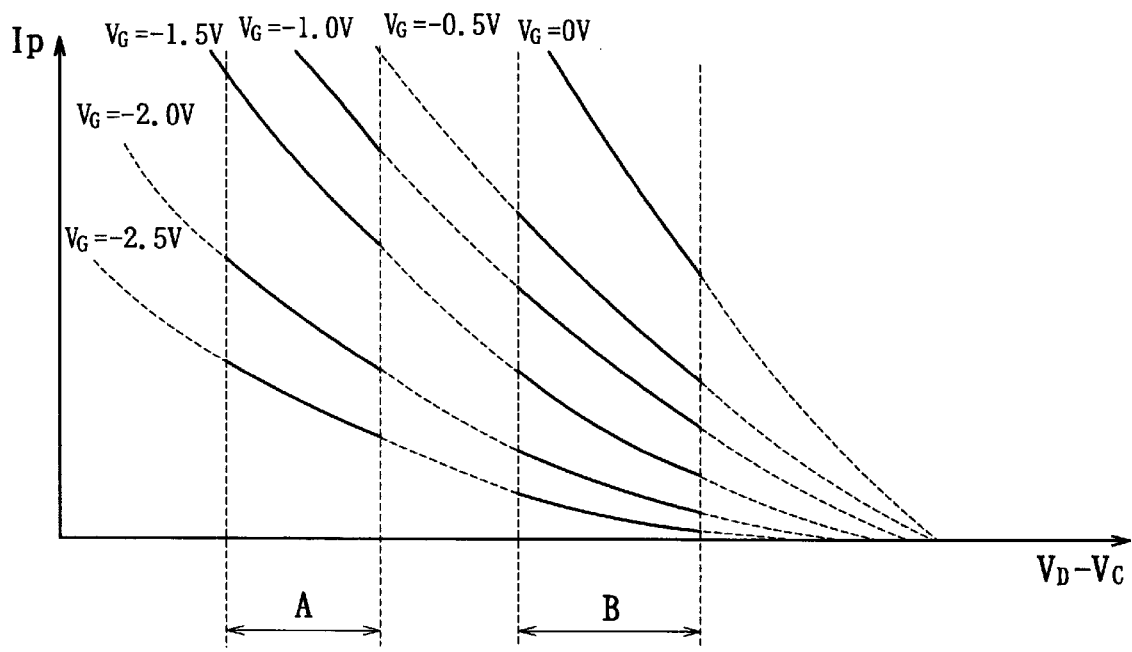
FIG. 3 is a view showing the relationship between a voltage difference of electrodes and a plate current.

As shown by the actual line in FIG. 3, the plate current $I_P$ is changed according to a difference between the variable voltage $V_D$ and the offset voltage $V_C$. Moreover, in an example shown in FIG. 3, the plate current $I_P$ is made constant in order to facilitate controlling of the plate current $I_P$, and then the gate voltage $V_G$ is changed between 0 to −2.5 V by −0.5 V at a time.

Although the control range A and the control range B of the variable voltage $V_D$ in FIG. 3 are identical in width with each other, the offset voltage $V_C$ is larger in the control range A than in the control range B. Thus, adjusting the offset voltage $V_C$ enables the distance $d_{GK}$ exhibited when $V_D V_C$=0 holds in FIG. 2, that is, the offset position of the cathodes 2a, 2b to be adjusted, thereby enabling the plate current $I_P$ to be adjusted, which magnifies the control/adjust range of the plate current $I_P$.

According to this embodiment, the displacement motion of the actuators 1a, 1b makes the position of the cathodes 2a, 2b with respect to the plate 4 variable, thereby causing the current $I_P$ taken out of the plate 4 to be controlled. This eliminates the need for elements of controlling the plate voltage, such as power amplifiers, which lowers the cost.

Further, integrating the actuators 1a, 1b at a high density miniaturizes the current controlling element, and generates a high current. Besides, a voltage applied to the actuator driving electrodes 9a, 9b and the actuator common electrodes 11a, 11b is lower than the plate voltage. Therefore, making only a voltage lower than the plate voltage variable enables the plate current to be controlled, which reduces the power consumption.

Figure 4:
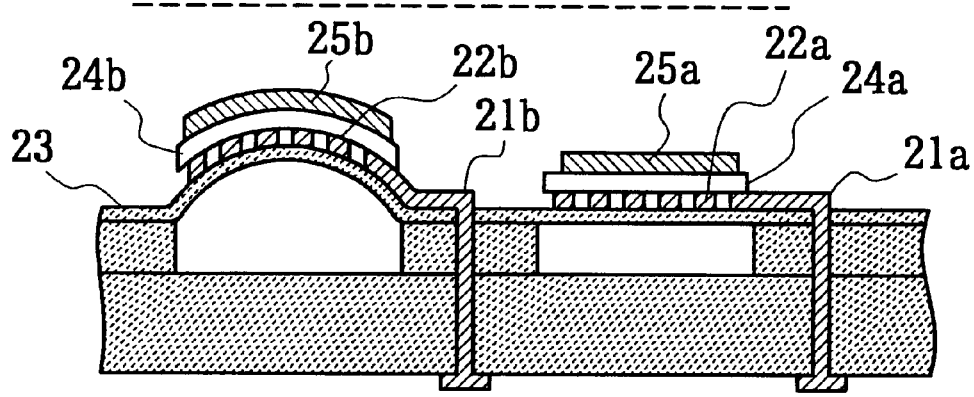
FIG. 4 is a sectional view of a current controlling element according to a second embodiment of the present invention.

FIG. 4 is a sectional view of a current controlling element according to a second embodiment of the present invention. In this embodiment, actuator driving electrodes 21a, 21b and actuator common electrodes 22a, 22b are interposed, respectively, between a sheet layer 23 and deformable layers 24a, 24b in a comb-like opposed manner, and cathodes 25a, 25b are directly formed on deformable layers 24a, 24b.

Figure 5:
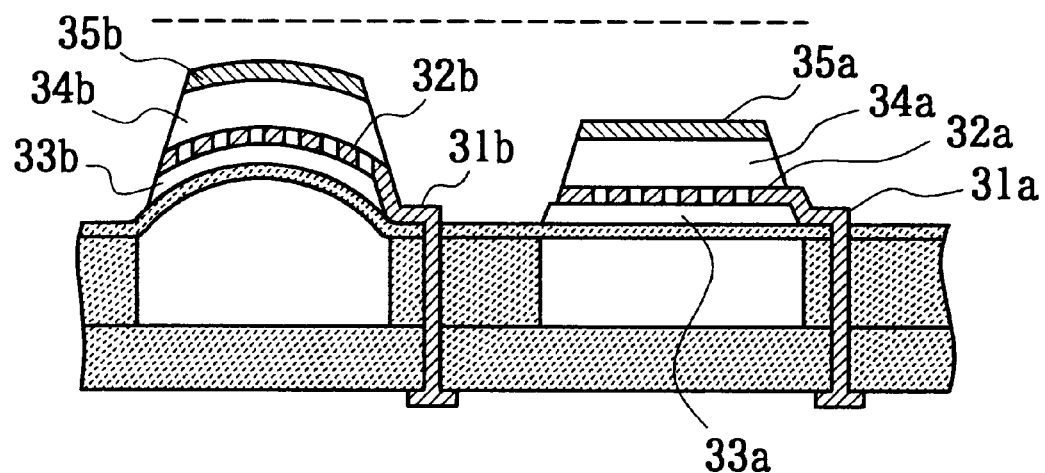
FIG. 5 is a sectional view of a current controlling element according to a third embodiment of the present invention.

FIG. 5 is a sectional view of a current controlling element according to a third embodiment of the present invention. In this embodiment, actuator driving electrodes 31a, 31b and actuator common electrodes 32a, 32b are interposed, respectively, between deformable layers 33a, 33b and insulating layers 34a, 34b in a comb-like opposed manner.

Figure 6:
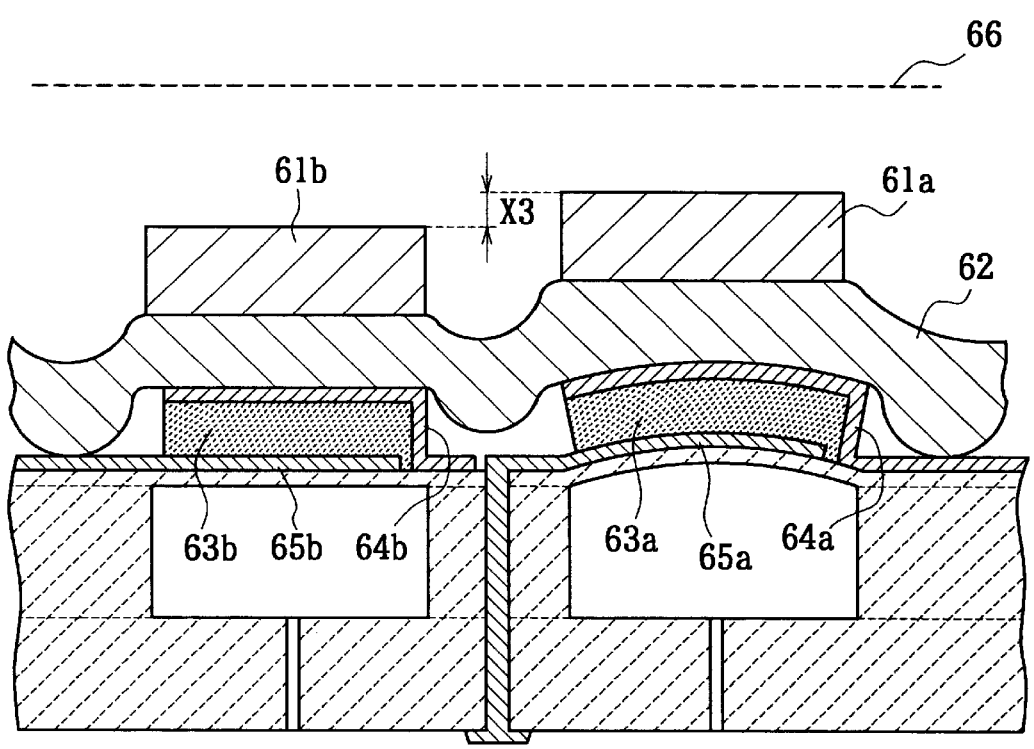
FIG. 6 is a sectional view of a current controlling element according to a sixth embodiment of the present invention.

FIG. 6 is a sectional view of a current controlling element according to a sixth embodiment of the present invention. In this embodiment, cathodes 61a, 61b are formed on a insulating layer 62. Deformable layers 63a, 63b are formed of antiferroelectric material, a predetermined voltage $V_C$ is applied to actuator common electrode 64a, 64b, and a variable voltage $V_D$ is applied to actuator driving electrodes 65a, 65b.

Figure 7:
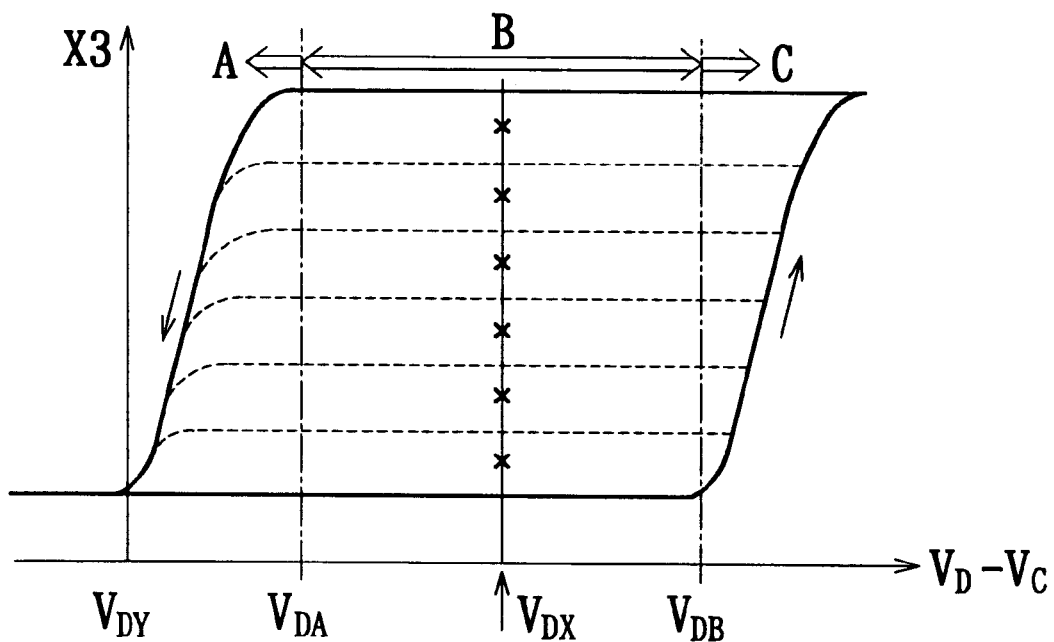
FIG. 7 is a view showing the relationship between the difference between the voltage of the actuator driving electrode and that of the actuator common electrode, and the displacement of the actuator.

FIG. 7 is a view showing the relationship between the difference between the voltage of the actuator driving electrode and that of the actuator common electrode, and the displacement x3 of the actuator. As shown in FIG. 7, if the difference between the voltage $V_D$ and the voltage $V_C$ changes within the range less than $V_{DA}$, the displacement x3 changes (region A), the difference between the voltage $V_D$ and the voltage $V_C$ changes within the range from $V_{DA}$ to $V_{DB}$, the displacement x3 remains constant (region B), and if the difference between the voltage $V_D$ and the voltage $V_C$ changes within the range more than $V_{DB}$, the displacement x3 changes (region C).

In the region A, the distance between the cathodes 61a, 61b and a grid 66 increases, and thus the plate current decrease. In the region B, the displacement state of the actuator is maintained. In the region C, the distance between the cathodes 61a, 61b and the grid 66 decrease, and thus the plate current increase.

Therefore, if the difference between the voltage $V_D$ and the voltage $V_C$ is set between $V_{DA}$ and $V_{DB}$, for example, the voltage $V_C$ is set to −$V_{DX}$ and the voltage $V_D$ is set to the neighborhood of zero, the displacement of the actuator is maintained without applying the voltage to the actuator driving electrodes 65a, 65b continuously. As a result, there is little power consumption resulting from the resistance of the actuator or a circuit including the actuator, and thus it is possible to reduce the power consumption further more, because a circuit for holding a constant voltage is provided at the side of the actuator common electrode, so that the power consumption resulting from the circuit does not increase even if the voltage $V_C$ is held at $-V_{DX}$, and a driving circuit mainly consist of parts such as transistor is provided on the side of the actuator driving electrode, there are many power consuming resistance component in the driving circuit so that the power consumption is reduced by setting the voltage $V_D$ to the neighborhood of zero.

If the deformable layers 63a, 63b are composed of a piezoelectric material which is curvedly displaced in a concave manner when the voltage is applied, the similar property as described above is obtained. In this case, the distance between the cathodes 61a, 61b and the grid 66 decreases and thus the plate current increases in the region A, and the distance between the cathodes 61a, 61b and the grid 66 increases and thus the plate current decreases in the region C.

The current controlling element having characteristics explained with reference to FIGS. 6 and 7 preferably comprises a switching element which switches between the displacement motion and the maintenance of displacement state of said actuator. Thereby, the switching between the displacement motion and the maintenance of displacement state of the actuator is well performed so that it is not necessary to apply the voltage to the second electrode in order to maintain the displacement of the actuator, and thus it is possible to reduce the power consumption of the current controlling element or the circuit including the current controlling circuit further more. Also, as there is no limitation of choice of an actuator material to be subjected to the displacement motion and the maintenance of displacement state of the actuator, and thus the limitation of choice of the actuator material is relaxed. The current controlling element comprising the switching element will be explained hereinafter.

Figure 8:
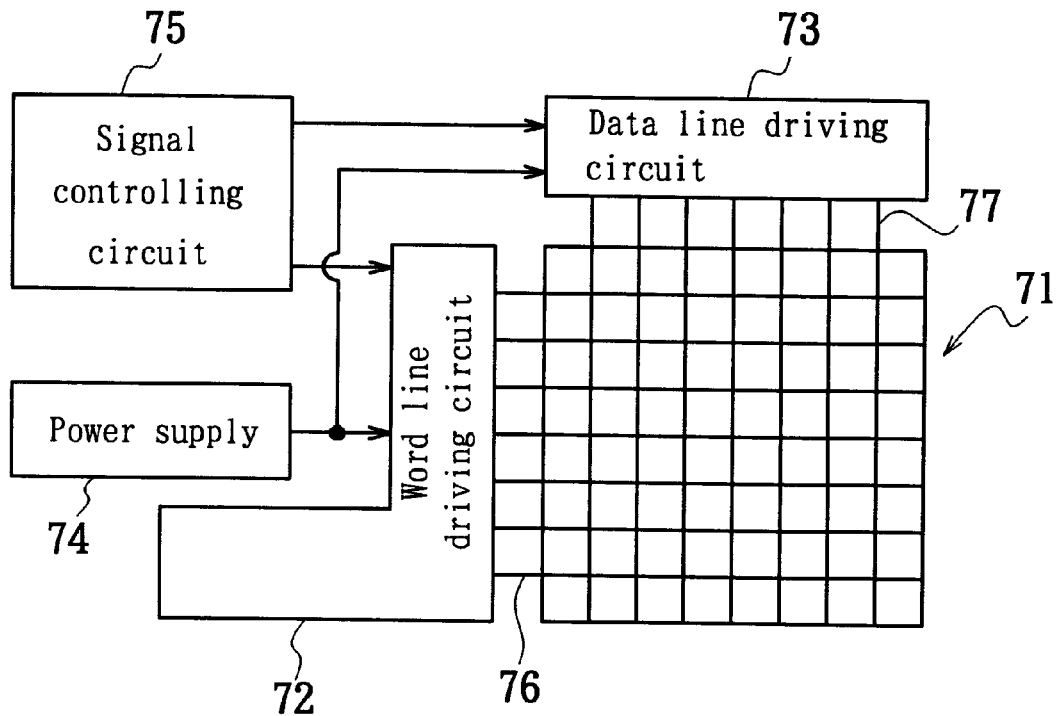
FIG. 8 is a view showing an example of a matrix array of current controlling elements, each of which comprises a switching element.

FIG. 8 is a view showing an example of a matrix array of current controlling elements, each of which comprises a switching element. This arrangement comprises an array of the current controlling elements, each of which comprises a switching element, a word line driving circuit 72, a data line driving circuit 73, a power supply 74, and a signal controlling circuit 75 supplying a control signal to the word driving circuit 72 and the data line driving circuit 73.

The word line driving circuit 72 supplies a certain number of driving signals to word lines 76 each corresponding to one of the driving signals selectively, and selects the actuator of the current controlling per row sequentially. The data line driving circuit 73 outputs a certain number of data signals to data lines 77 each corresponding to one of the data signals in parallel, and supplies the data signals to the switching elements in a row selected by the word line driving circuit 72, respectively.

The power supply 74 supplies a logical supply voltage for calculating in a logical circuit and two kinds of supply voltages for the word lines to the word line driving circuit 72. The power supply 74 also supplies the logical supply voltage and two kinds of supply voltage for the data lines to the data line driving circuit 73.

Figure 9:
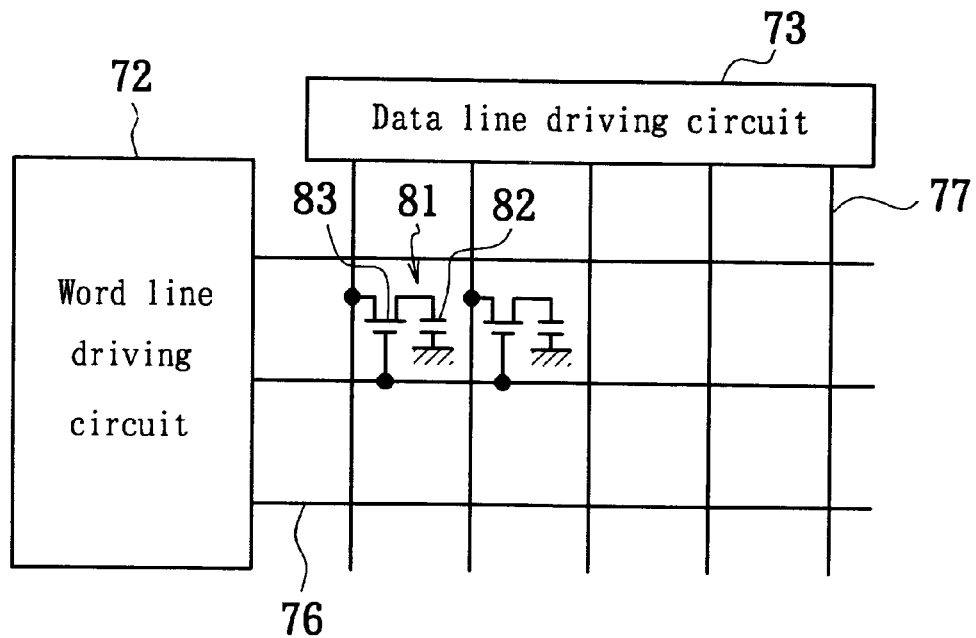
FIG. 9 is a view showing an example of an array of current controlling elements in which a transistor is used as the switching element.
Figure 10:
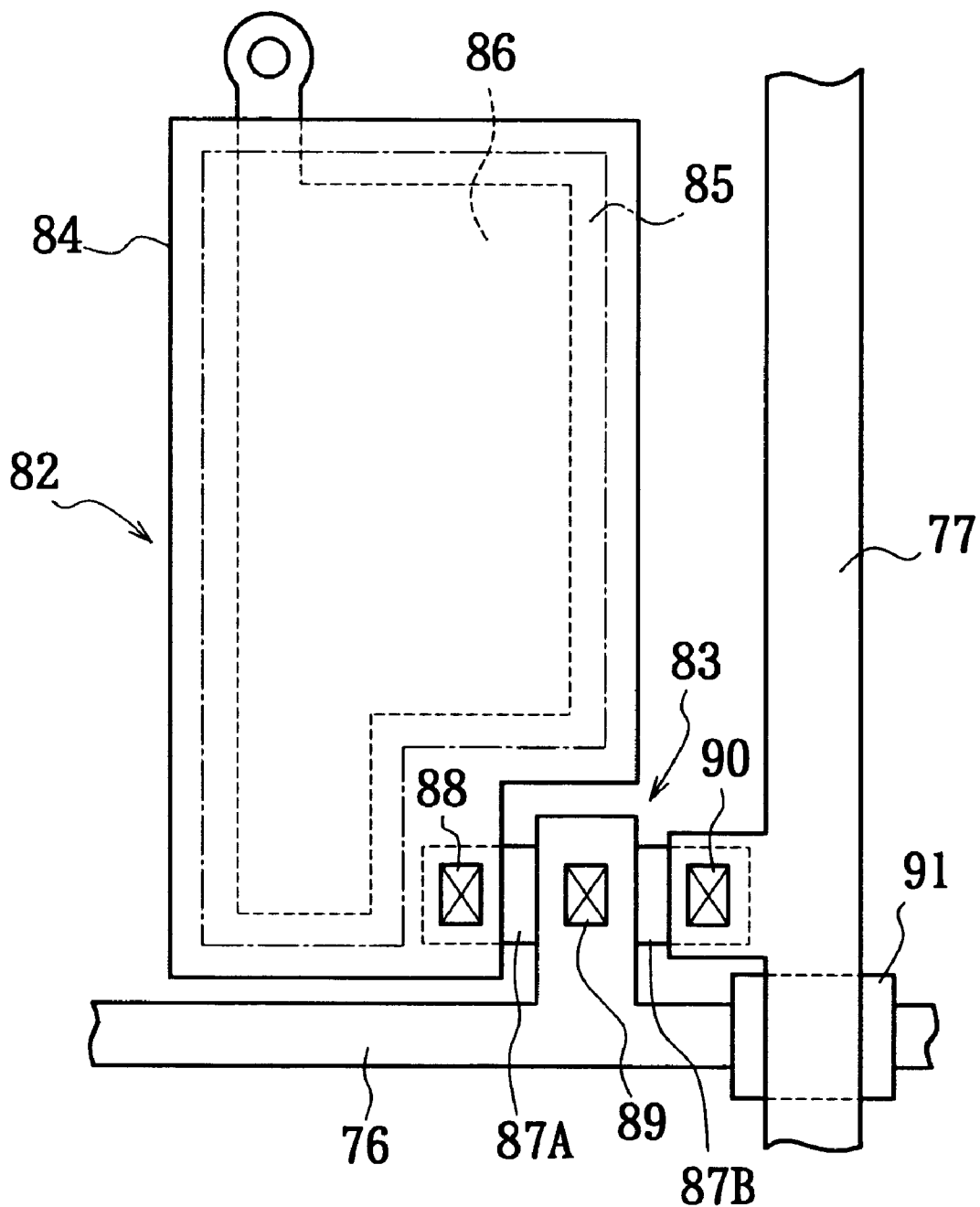
FIG. 10 is a top view showing an example of an array of current controlling elements in which a transistor is used as the switching element.

FIG. 9 is a view showing an example of a array of current controlling elements in which a transistor is used as the switching element, and FIG. 10 is a top view showing an example of a array of current controlling elements in which a transistor is used as the switching element. In this case, each of the current controlling element 81 has an actuator 82 and a transistor 83.

In FIG. 10, a plane shape of an actuator driving electrode 84 as shown in a solid line, a plane shape of a deformable layer 85 as shown in a dashed line, and an outer shape of an actuator common electrode 86 as shown in a broken line are rectangular, respectively. In this case, the area of the deformable layer 85 in the plane shape is larger than that of the actuator common electrode 86 in the outer shape, and is smaller than that of the actuator driving electrode 84 in the plane shape.

The actuator driving electrode 84 is connected to source/drain regions 87A through a contact 88. The word line 76 is connected to a gate electrode of the transistor 83 through a contact 89. The data line 77 is connected to drain/source regions 87B through a contact 90. A insulating layer 91 consisting of a silicon oxide layer, a glass layer, a resin layer and so on is interposed in an intersection of the word line 76 and the data line 77.

When a certain row is selected by the word line driving circuit 72, all transistors concerning to the row are turned on, thereby, the data signal through the data line driving circuit 73 is supplied to the actuator driving electrode 84 through a channel region of the transistor 83.

If a transistor is used as the switching element, the above-mentioned two kinds of the supply voltages for the word lines are a voltage to turn on the transistor 83 (hereinafter, "on voltage") and a voltage to turn off the transistor 83 (hereinafter, "off voltage").

Also, the above-mentioned two kinds of the supply voltages for the data lines are a voltage enough to curvedly displace the actuator 82 (hereinafter, "operating voltage") and a voltage enough to restore it to the original state (hereinafter, "reset voltage"). It is possible to obtain the desired amount of the plate current by preparing not less than two kinds of the operating voltages when selecting the actuator 82 and being capable of setting a plurality kinds of positions of the cathode to the plate.

Figure 11A:
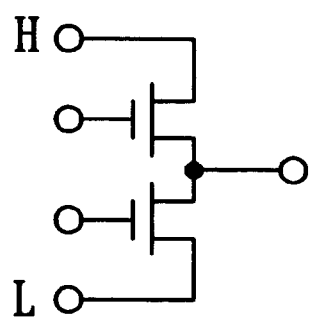
FIGS. 11A and 11B are views showing a circuit used in a word line driving circuit and a data line driving circuit, respectively.
Figure 11B:
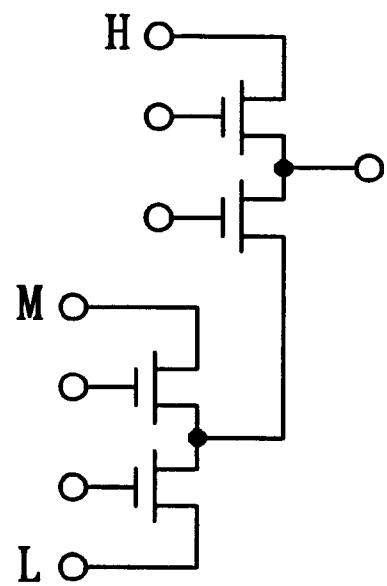

Therefore, as the word line driving circuit 72 and the data line driving circuit 73, it is possible to use a simple circuit switching between two levels of the voltage ("H" or "L") only, for example, a serial-parallel converter comprising a push-pull circuit consisting two MOSFET serially connected to each other as shown in FIG. 11A, or circuits each combines two push-pull circuits as shown in FIG. 11B, the number of the circuit included in the serial-parallel converter is the number of the channels. By forming the data line driving circuit as shown in FIG. 11B, it is possible to apply two kinds of the operating voltages except for the reset voltage.

Figure 12:
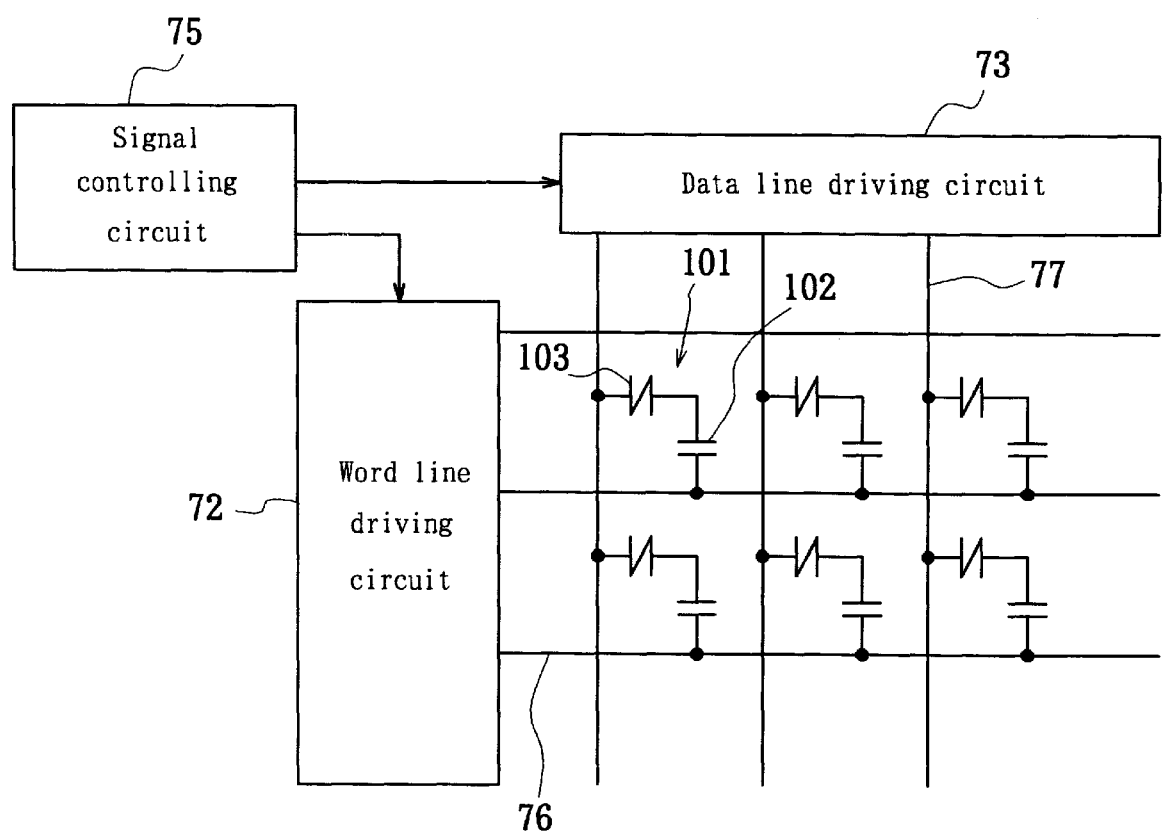
FIG. 12 is a view showing an example of an array of current controlling elements in which a varistor is used as the switching element.
Figure 13:
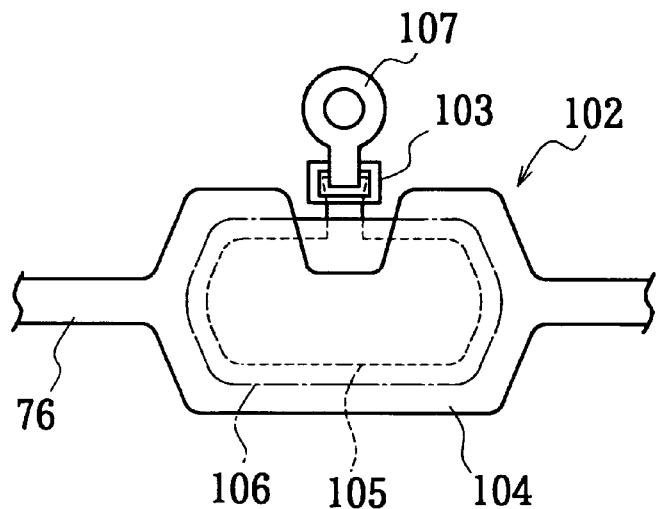
FIG. 13 is a top view showing an example of an array of current controlling elements in which a varistor is used as the switching element.

FIG. 12 is a view showing an example of a array of current controlling elements in which a varistor is used as the switching element, and FIG. 13 is a top view showing an example of a array of current controlling elements in which a varistor is used as the switching element. In this case, each of the current controlling elements has an actuator 102 and a varistor 103.

As shown in FIG. 13, the word line 76 is connected to an actuator common electrode 104, and the data line 77 is connected to an actuator driving electrode 105 shown in a broken line. Between the actuator common electrode 104 and the actuator driving electrode 105, there is a deformable layer 106 shown in a dashed line. A through-hole 107 electrically connects the actuator driving electrode 105 to the data line 77.

The varistor 103 is a resistive element changing the value of resistance non-linearly in accordance with the variation of the applied voltage, consists of a SiC varistor, a pnp varistor of Si, a varistor mainly composed of ZnO and so on, and has a negative property in which the value of the resistance decreases as the voltage across the ends of the varistor increases.

A preferable property of the varistor 103 will be described.

First, the off-resistance of the varistor 103 is set so that the rate of the variation of the applied voltage to the actuator 102 is within 5% when the leakage current (discharge) generates. When the off-resistance is too small, the charges stored in the actuator 102 are discharged, and the displacement state of the actuator 102 cannot be maintained. The rate of the variation of the applied voltage to the actuator 102 is explained as the sum of the rate of the variation resulting from the partial potential of the electric capacity in the varistor 103 (5%) and the rate of the variation resulting from the leakage current.

By setting the off-resistance in such a manner, the CR time constant becomes relatively large, and by effecting the low-pass filter resulting from such a relatively large CR time constant, the applied voltage to the actuator 102 is maintained at substantially constant value by smoothing. As a result, the displacement state of the actuator 102 is maintained.

On the other hand, the on-resistance of the varistor 103 is set at such a value that the applied voltage to the actuator 102 rises up to 95% of the defined voltage When an on-signal is supplied to one electrode of the varistor 103, the applied voltage to the actuator 102 rises rapidly, and reaches to 95% of the defined voltage instantly. Therefore, the actuator is curvedly displaced in one direction instantly.

Figure 14A:
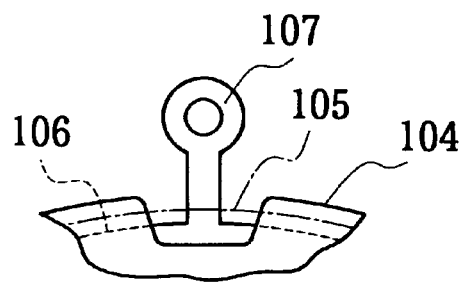
FIGS. 14A and 14B are top views showing an example of an array of the current controlling elements in which a varistor is used as the switching element, respectively.
Figure 14B:
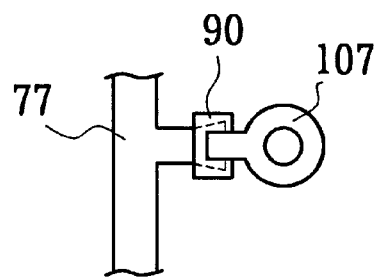

In the example as shown in FIG. 13, the actuator 102, the varistor 103 and the word line 76 are formed on one face of a substrate, and the data line 77 is formed on the other face of the substrate, however, it is possible to form the actuator 102 and the word line 76 on one face of the substrate and to form the varistor 103 and the data line 77 on the other face of the substrate as shown in FIGS. 14A and 14B.

Figure 15:
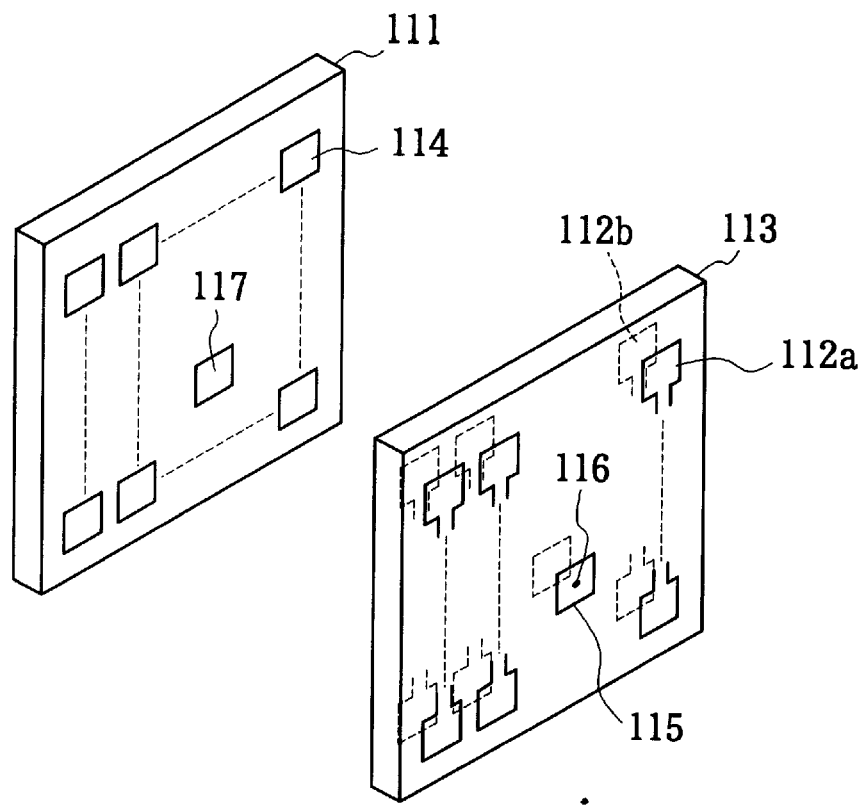
FIG. 15 is a view explaining the way to constitute the current controlling element in which a varistor is used as the switching element.

If the switching element is constituted as shown in FIG. 15, there is a first substrate 111 providing a plurality of actuators (not shown in FIG. 18) on one face, and a second substrate 113 providing electrodes 112a, 112b on both faces. For the actuators, through-holes extending from one face of the first substrate 111 to the other face of the first substrate 111 are formed, respectively, and for the through-holes, electrode pads 114 are provided on the other face of the first substrate 111, respectively. In other words, these electrode pads 114 are provided on the positions corresponding to the actuators provided on one face of the first substrate 111, respectively.

The electrode pads 114 are provided on the position corresponding to the electrodes 112, respectively. By selecting a material composing the second substrate 113 appropriately, the function of the varistor corresponding to the actuators formed on the first substrate 111 is obtained.

Among the electrodes provided on the second substrates 113, the electrode 115 which is not necessary to have the function of the varistor, for example, the electrode 115 for taking out the word line 76 is connected to the electrode pad 117 for taking out the word line 76 formed on the other face of the word line 76 by a through-hole 116.

When the other face of the first substrate 111 providing the electrode pads 114 is fitted on one face of the second substrate 113 providing the electrodes 112b, the electrode pad 114 and the corresponding electrode 112b are bonded to each other with a solder, a conductive resin and so on.

Thereby, the actuator driving electrode of the actuator and the data line 77 are electrically connected to each other through the varistor 103.

The thickness of the second substrate 113 is determined in accordance with the required varistor voltage, and the surface area of the electrode of the varistor 103 is determined by the required electrostatic capacity and current capacity.

In order to reduce the leakage current between the electrodes 112a, 112b neighboring to each other and formed on the same face of the second substrate 113 and to increase the degree of freedom to arrange the electrodes 112a, 112b, for example, each of the grooves is provided between the electrodes 112a, 112b neighboring to each other and formed on the same face of the second substrate 113, or a material with a relatively small particle diameter is selected as that composing the second substrate 113 and the thickness of the second substrate 113 is made small.

If each of the grooves is provided between the electrodes 112a, 112b neighboring each other, the distance between the electrodes 112a, 112b neighboring each other and formed on the same face increases in essence, and thus the varistor voltage between them increases. On the other hand, if a material with a relatively small particle diameter is selected as that comprising the second substrate 113 and the thickness of the second substrate 113 is made small, the varistor voltage between the electrodes 112a, 112b neighboring to each other increases while a certain varistor voltage is maintained between the electrodes 112a, 112b.

As the second substrate 113 for composing the varistors 103 in addition to the first substrate 111 forming the actuators 102 and the other face of the first substrate 111 is put on one face of the second substrate 113 in such a manner, it is very simple to construct the wiring to connect the varistor 103 between the actuator 102 and the data line 77, it is possible to make the device with a small entire size, and thus it is advantageous in view of the development of the yield, the reduction of the manufacturing cost and so on.

If the varistor is used as the switching element, it is possible to adopt the electrode construction as shown in FIGS. 3 and 4.

Figure 16:
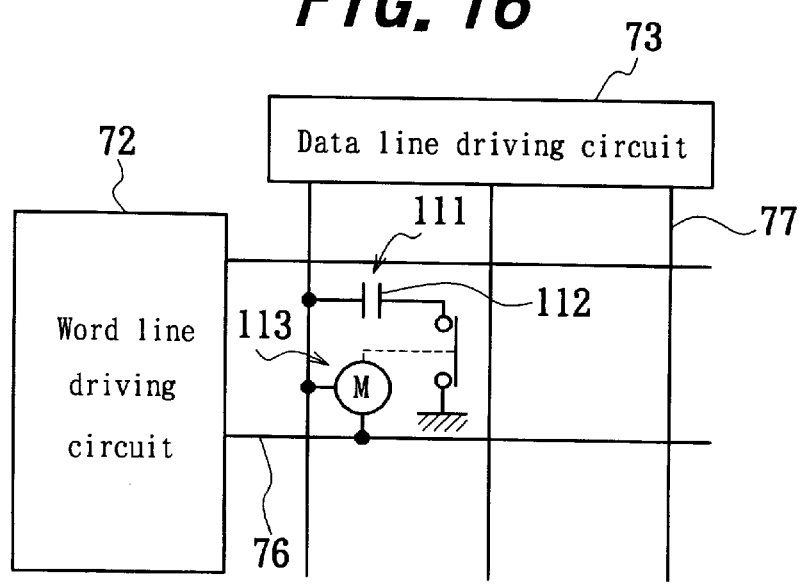
FIG. 16 is a view showing an example of an array of current controlling elements in which a piezoelectric relay is used as the switching element.
Figure 17:
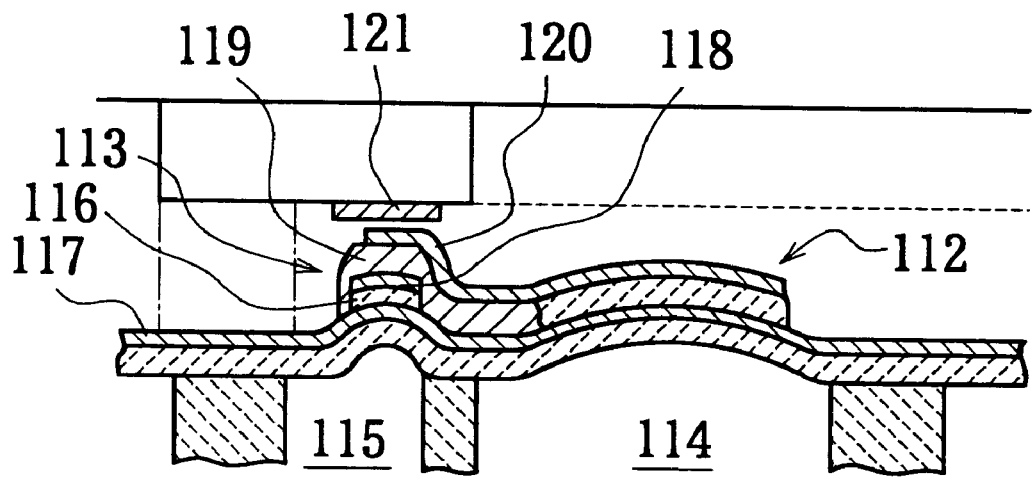
FIG. 17 is a sectional view showing a current controlling element in which a piezoelectric relay is used as the switching element.
Figure 18:
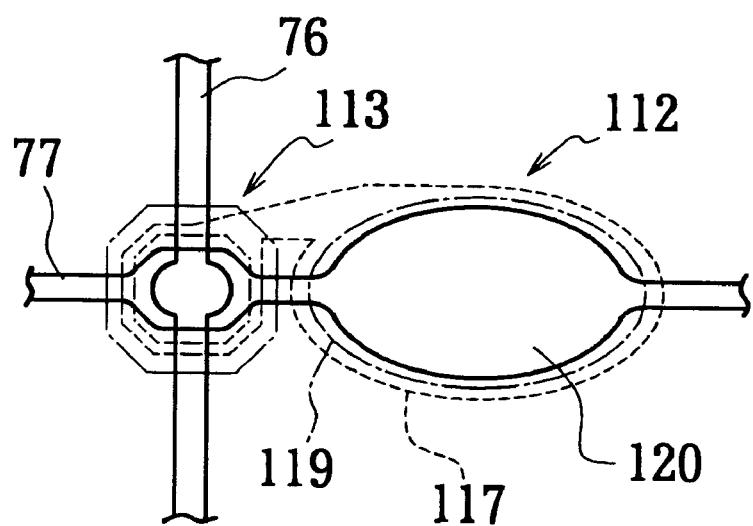
FIG. 18 is a top view showing a current controlling element in which a piezoelectric relay is used as the switching element.

FIG. 16 is a view showing an example of a array of current controlling elements in which a piezoelectric relay is used as the switching element, FIG. 17 is a sectional view showing a current controlling element in which a piezoelectric relay is used as the switching element, and FIG. 18 is a top view showing a current controlling element in which a piezoelectric relay is used as the switching element. In this case, each of the current controlling elements 111 has an actuator 112 and a piezoelectric relay 113.

As shown in FIGS. 17 and 18, the piezoelectric relay 113 is arranged at the position neighboring the actuator 112. A space 115 for constructing the piezoelectric relay 113 is provided at the inside of a substrate for actuator 112 in addition to a space 114 for constructing the actuator 112. The space 115 is connected to external by a through hole not shown.

In this case, the thickness of the portion forming the space 115 is smaller than that of the portion except that forming the space 115. As a result, the portion forming the space 115 has a construction tending to suffer from the vibration resulting from external stress, and functions as a vibrating section of the piezoelectric relay 113. The portion except that forming the space 115 functions as a stationary section of the piezoelectric relay 113 supporting the vibrating section of the piezoelectric relay 113.

As shown in FIGS. 20 and 21, the piezoelectric relay 113 comprises a deformable layer 116, an electrode 117 formed under the deformable layer 116, an electrode 118 for connecting to the word line 76, an insulating layer 119 formed on the electrode 118, an electrode 120 formed on the insulating layer 119, and an earth electrode 121 facing to the electrode 120. Among these electrodes, the electrode 117 serves as the actuator driving electrode, and the electrode 120 serves as the actuator common electrode.

Figure 19:
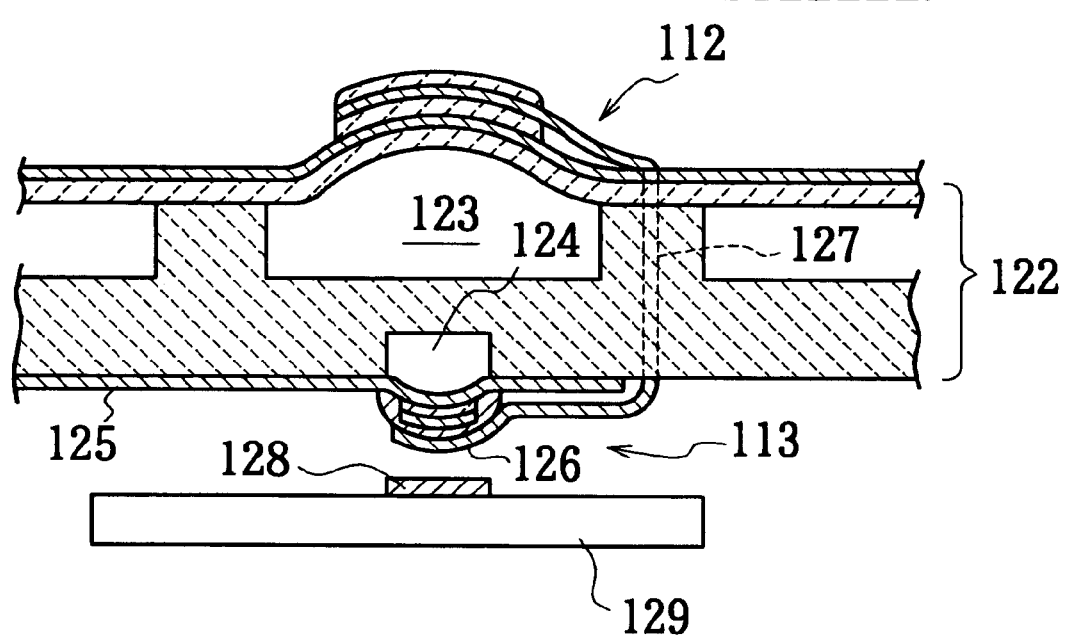
FIG. 19 is a sectional view showing another current controlling element in which a piezoelectric relay is used as the switching element.

FIG. 19 is a sectional view showing another current controlling element in which a piezoelectric relay is used as the switching element. In this example, the actuator 112 is provided on one face of a substrate 122, and the piezoelectric relay 113 is provided on the other face of the substrate 122.

In this case, spaces 123 and 124 are formed at the portions corresponding to the actuator 112 and the piezoelectric relay 113, respectively. A data line 125 only for switching is provided on the other face of the substrate 122. An electrode 126 formed on the piezoelectric relay 113 is wired by a through-hole 127 formed on the substrate 122, and an earth electrode 128 contacting the electrode 126 selectively is formed on a printed wiring board 129 arranged below the substrate 122.

The present invention is not limited to the details of the illustrated embodiments, but may be embodied with various changes, modifications and improvements.

For example, a current controlling element according to the present invention can be employed as large output current-service switches such as thyristors. Also, a current controlling element according to the present invention can constitute other kinds of multielectrode tubes. For example, a pentode can be formed by omitting one grid from grids of a conventional pentode.

What is claimed is:

1. A current controlling element comprising:
    an actuator having a fixed portion, a vibrating portion supported on said fixed portion so as to undergo vibrations, and an actuating portion including a first and a second electrodes formed on at least one side of a deformable layer, said actuator generating a displacement motion by holding an offset electric potential of said first electrode at a desired value and variable-controlling an electric potential of said second electrode;
    a cathode formed on said actuator for emitting electrons;
    a plate for receiving said electrons emitted from said cathode; and
    at least one grid arranged between said cathode and said plate,
    wherein said current controlling element changes a position of said cathode with respect to said plate by said displacement motion of said actuator obtained by changing an electric potential difference of said second electrode to said offset electric potential, and adjusting the offset position of said cathode according to said offset electric potential, to adjust a control range of a current value taken out of said plate.

2. A current controlling element according to claim 1, wherein said electrical potential of said plate with respect to said cathode is held at a constant value.

3. A current controlling element according to claim 1, wherein an insulating layer is formed on at least one of said first and said second electrodes, and said cathode is formed on said insulating layer.

4. A current controlling element according to claim 1, wherein said current controlling element comprises a plurality of said cathodes corresponding to one plate, and a plurality of said actuators corresponding to a plurality of said cathodes, respectively.

5. A current controlling element according to claim 1, wherein said vibrating portion comprising a ceramic material.

6. A current controlling element according to claim 1, wherein said vibrating portion and said fixed portion are integrally formed.

7. A current controlling element according to claim 1, wherein said vibrating portion and said fixed portion are integrally formed of ceramics.

8. A current controlling element according to claim 1, wherein said actuating portion, said vibrating portion and said fixed portion are integrally formed.

9. A current controlling element according to claim 1, wherein said deformable layer comprising at least one material selected from the group consisting of a piezoelectric material, an electrostrictive material, and an antiferroelectric material.

10. A current controlling device according to claim 1, comprising a plurality of said current controlling elements, wherein a plurality of said actuators of said current controlling elements are integrally formed on a substrate.

11. A current controlling element comprising:
    an actuator having a fixed portion, a vibrating portion supported on said fixed portion so as to undergo vibrations, and an actuating portion including a first and a second electrodes formed on at least one side of a deformable layer, said actuator generating a displacement motion by holding an offset electric potential of said first electrode at a desired value and variable-controlling an electric potential of said second electrode;
    a cathode formed on said actuator for emitting electrons;
    a plate for receiving said electrons emitted from said cathode; and
    at least one grid arranged between said cathode and said plate;
    wherein said current controlling element changes a position of said cathode with respect to said plate by said displacement motion of said actuator obtained by changing an electric potential difference of said second electrode to said offset electric potential, and adjusting the offset position of said cathode according to said offset electric potential, to adjust a control range of a current value taken out of said plate;
    and said actuator maintains the displacement state by setting the electric potential of said first electrode at a certain value while holding the electric potential of said second electrode at substantially zero.

12. A current controlling element according to claim 11, comprising a switching element which switches between said displacement motion and the maintenance of said displacement state of said actuator.

13. A current controlling element according to claim 12, wherein said switching element includes at least one element selected from the group consisting of a transistor, a varistor and a piezoelectric relay.

14. A current controlling element according to claim 11, wherein said electrical potential of said plate with respect to said cathode is held at a constant value.

15. A current controlling element according to claim 11, wherein an insulating layer is formed on at least one of said first and said second electrode, and said cathode is formed on said insulating layer.

16. A current controlling element according to claim 11, further comprising a plurality of said cathodes corresponding to one plate, and a plurality of said actuators corresponding to a plurality of said cathodes, respectively.

17. A current controlling element according to claim 11, wherein said vibrating portion comprises a ceramic material.

18. A current controlling element according to claim 11, wherein said vibrating portion and said fixed portion are integrally formed.

19. A current controlling element according to claim 11, wherein said vibrating portion and said fixed portion are integrally formed of ceramics.

20. A current controlling element according to claim 11, wherein said actuating portion, said vibrating portion and said fixed portion are integrally formed.

21. A current controlling element according to claim 11, wherein said deformable layer is formed of at least one material selected from the group consisting of a piezoelectric material, an electrostrictive material, and an antiferroelectric material.

22. A current controlling device according to claim 12, comprising a plurality of said current controlling elements, wherein a plurality of said actuators of said current controlling elements are integrally formed on a substrate.

* * * * *